United States Patent [19]

Itoh

[11] 4,246,544
[45] Jan. 20, 1981

[54] BIAS CIRCUIT FOR A LINEAR AMPLIFIER
[75] Inventor: Noriji Itoh, Yokohama, Japan
[73] Assignee: Tokyo Shibaura Denki Kabushiki Kaisha, Kawasaki, Japan
[21] Appl. No.: 35,640
[22] Filed: May 3, 1979
[30] Foreign Application Priority Data
  May 15, 1978 [JP] Japan .................................. 53/57411
  May 15, 1978 [JP] Japan .................................. 53/57412
[51] Int. Cl.³ .............................................. H03F 1/08
[52] U.S. Cl. ...................................... 330/293; 330/296
[58] Field of Search ............................... 330/296, 293
[56] References Cited
  U.S. PATENT DOCUMENTS
  3,296,544  1/1967  Grace ................................... 330/293

FOREIGN PATENT DOCUMENTS
45-39203  2/1970  Japan .

Primary Examiner—Harold A. Dixon
Attorney, Agent, or Firm—Cushman, Darby & Cushman

[57] ABSTRACT

A bias circuit for a linear amplifier having an NF amplifier whose NF loop includes a first capacitor, bias means for providing a given bias potential to the amplifier through a charging circuit of a second capacitor and precharge means for precharging the first capacitor only when the second capacitor is charged by the given bias potential. With such a circuit connection, the first capacitor is charged within a short period from the time when the power source has been in ON state.

28 Claims, 13 Drawing Figures

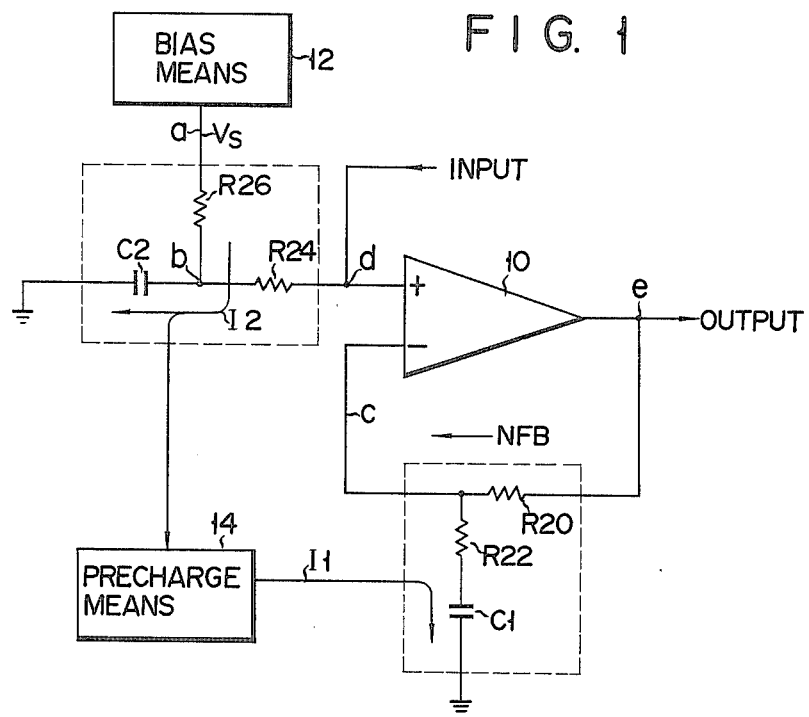
F I G. 1
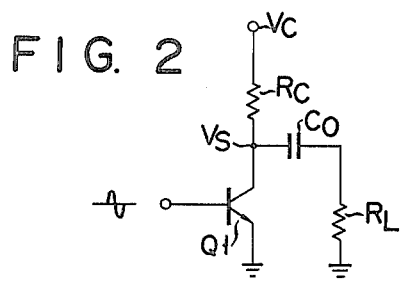
F I G. 2

F I G. 10
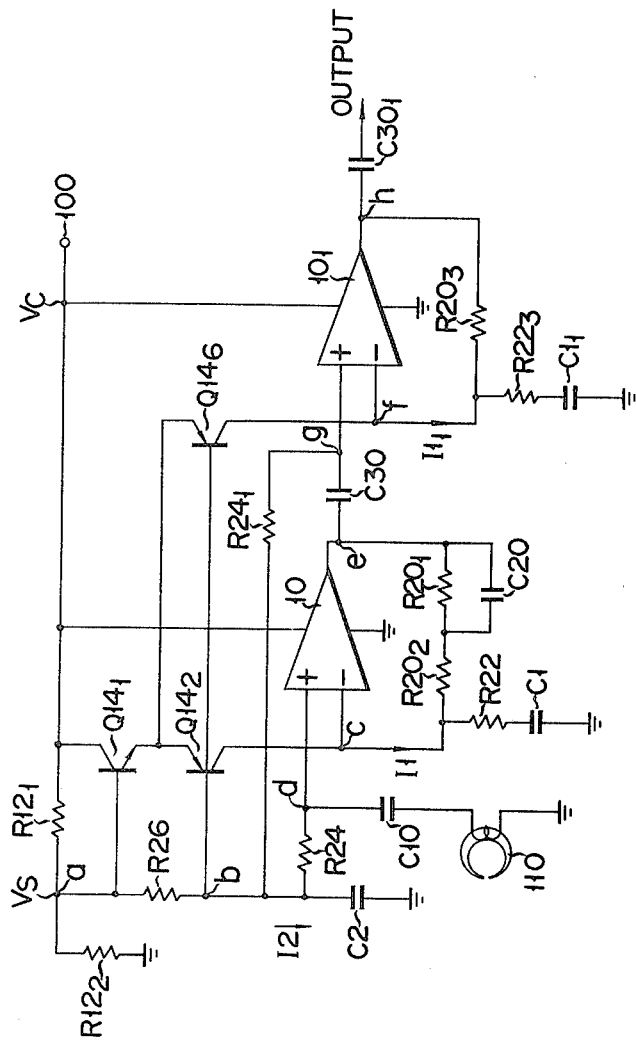

BIAS CIRCUIT FOR A LINEAR AMPLIFIER

The present invention relates to a bias circuit to shorten a transient period from the instant when a power source is turned on until an amplifier related is biased to be settled in a stationary state.

A linear amplifier for amplifying an analog signal must have a given AC gain with a stable operating point. It is for this reason that an NFB (negative feed back) of 100% in a DC region is generally applied to the linear amplifier. The AC gain depends on a transfer function of the NFB circuit. In such an NFB circuit, a capacitor for blocking a DC component is inserted in series fashion in an NF branch between a feedback signal line and a ground line. When a single power source feeds power to a linear amplifier including such an NFB circuit, several seconds or more are frequently taken for a time period from the time when the power feeding is initiated until the operation point of the amplifier is settled in a stationary state.

Let us consider a case, for example, where the amplifier is applied to a playback equalizer circuit of a battery-drive tape recorder. The playback equalizer of the tape recorder must have a large gain in a low frequency region. For this reason, the DC blocking capacitor must have a very large charge time constant is required for the DC blocking capacitor. Accordingly, the equalizer of this type takes several seconds for the time period from the instant when a power source is turned on till the equalizer becomes in a normal operating condition. That is to say, its power source response is poor. In the battery-drive tape recorder, a power source is turned on and off every time that its operation mode is switched to a playback mode or a stop mode, for preventing the super-fluous power consumption of the battery. In this type tape recorder, upon depression of a playback button, large pop noise appears and, after one to two seconds, a reproduced or playback sound is produced. The pop noise and poor power source response give users an unpleasant feeling, considerably devaluing commodity value of the devices.

Some measures having been taken to solve this problem provide some circuits to speed up the charge speed of the DC blocking capacitor for a short time after the power source is turned on. However, insufficient consideration is given to the operation timing of the speed-up circuit, and therefore the improvement of the power source response is insufficiently attained. Specifically, the precharging for the DC blocking capacitor is excessive or insufficient, with the result that it is very difficult to reliably shorten a time period from the power supply initiation to the stationary state.

Accordingly, an object of the present invention is to provide a bias circuit for use with a linear amplifier for improving the power source response of the linear amplifier.

To achieve the above object of the invention, there is provided a bias circuit for a linear amplifier comprising: (a) amplifier means with inverted and non-inverted input terminals; (b) negative feedback means inserted between the output terminal of the amplifier means and the inverted input terminal; (c) a first capacitor inserted between a feedback signal circuit of the negative feedback means and a circuit with zero AC potential, the first capacitor making a DC transfer function of the negative feedback means larger than an AC transfer function of it; (d) bias means for applying to the amplifier means such a given bias potential as to clip the AC output signal from the amplifier means symmetrically with respect to zero level; (e) a second capacitor connected between a circuit for providing the given bias potential and the circuit with zero AC potential in a place disposed between the bias means and the non-inverted input terminal of the amplifier means, the second capacitor being charged by the bias means from the instant when a power supply circuit starts to supply power to the amplifier means; and (f) precharge means for feeding precharge current to the first capacitor only for a period of time from the initiation of the power supply to the amplifier means until the amplifier means is biased by the given bias potential.

With such a construction, the first capacitor is precharged only for time till the amplifier means is biased by the given bias potential. The precharging operation speeds up the charging speed of the first capacitor. The precharging operation for the first capacitor continues until the amplifier means is biased up to the given bias potential. Therefore, the precharge amount is properly controlled. As a consequent, the power source response is improved and the pop noise immediately after the power source is turned on is considerably reduced because a proper precharge amount is always kept.

Additional objects and advantages of the present invention will become apparent to persons skilled in the art from a study of the following detailed description of the accompanying drawings, in which:

FIG. 1 shows a basic circuit construction of a bias circuit according to the invention;

FIG. 2 shows a circuit diagram for illustrating how a given bias potential is set when the output stage of an amplifier is of a single construction;

Figure 3:
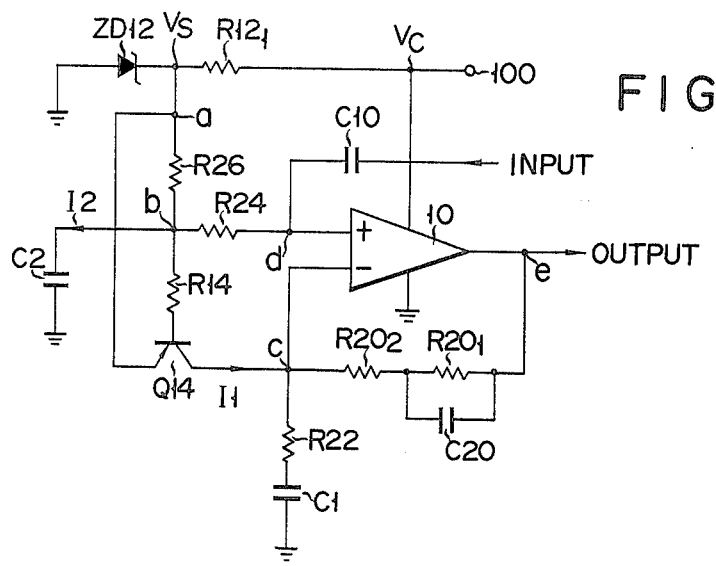
FIG. 3 shows a circuit diagram of the basic construction shown in FIG. 1.
Figure 5:
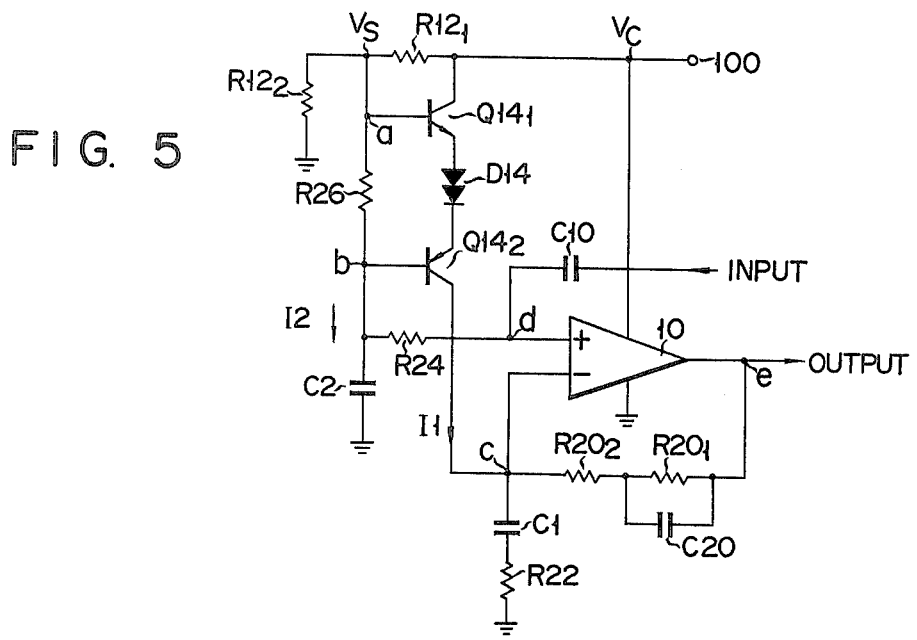
Figure 4:
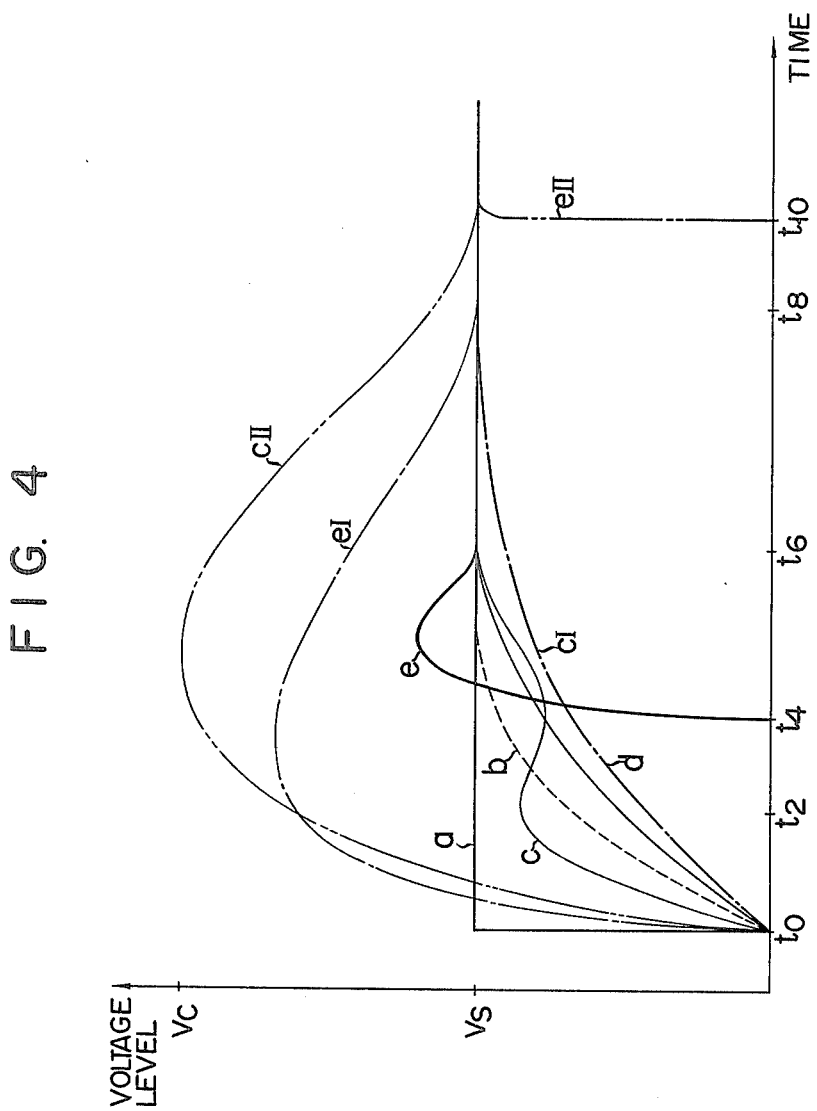
Figure 6:
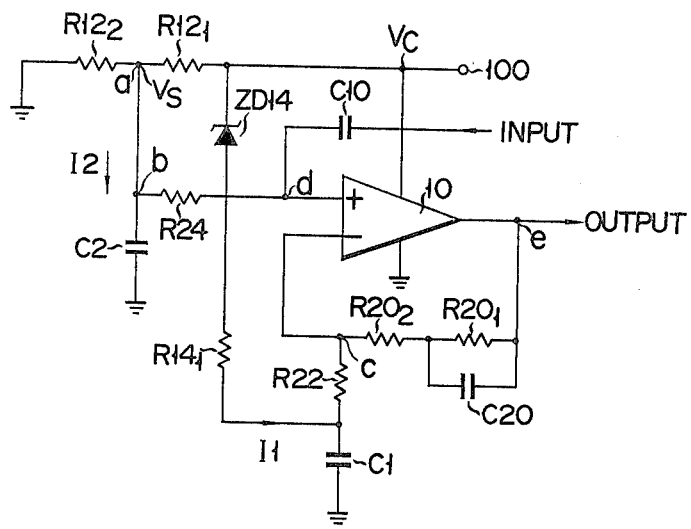
Figure 7:
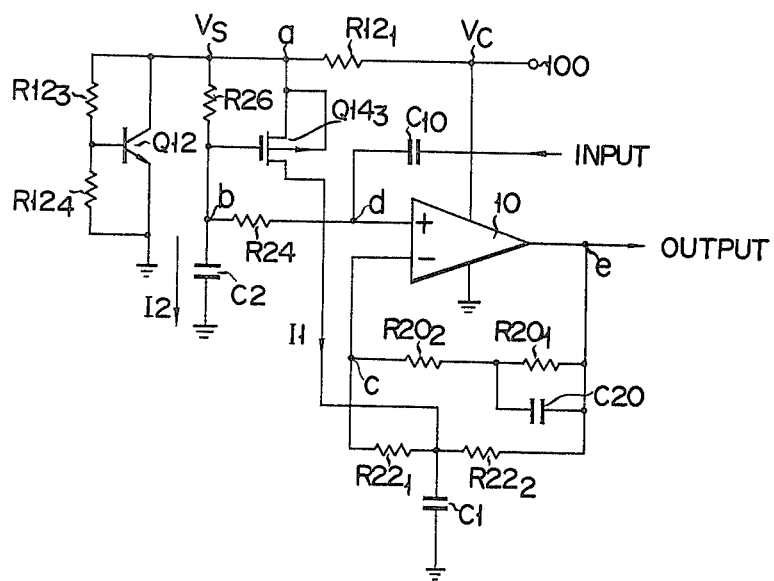
Figure 8:
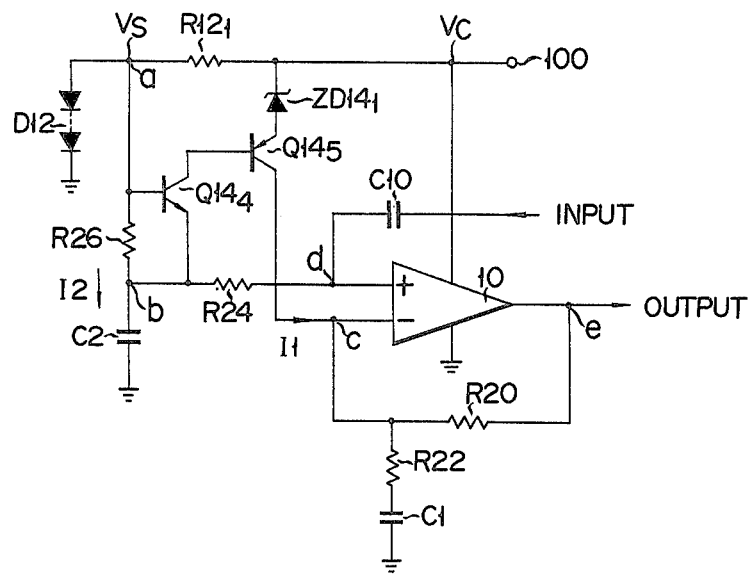
Figure 9:
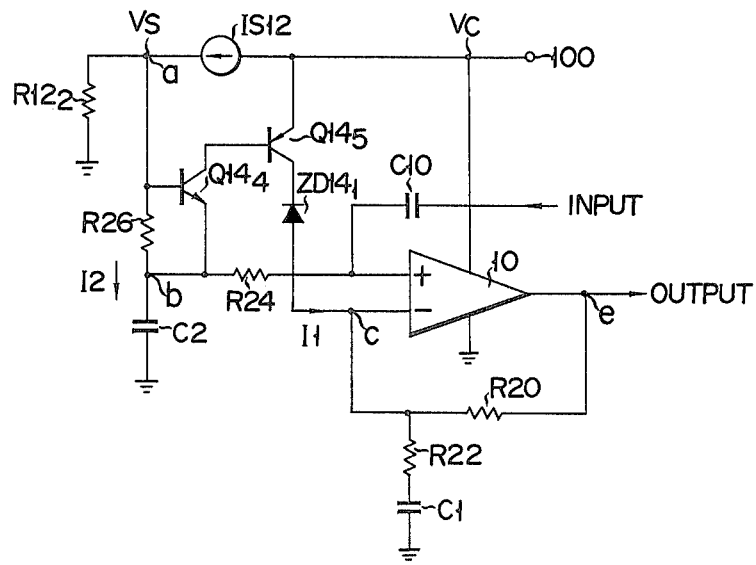
Figure 11:
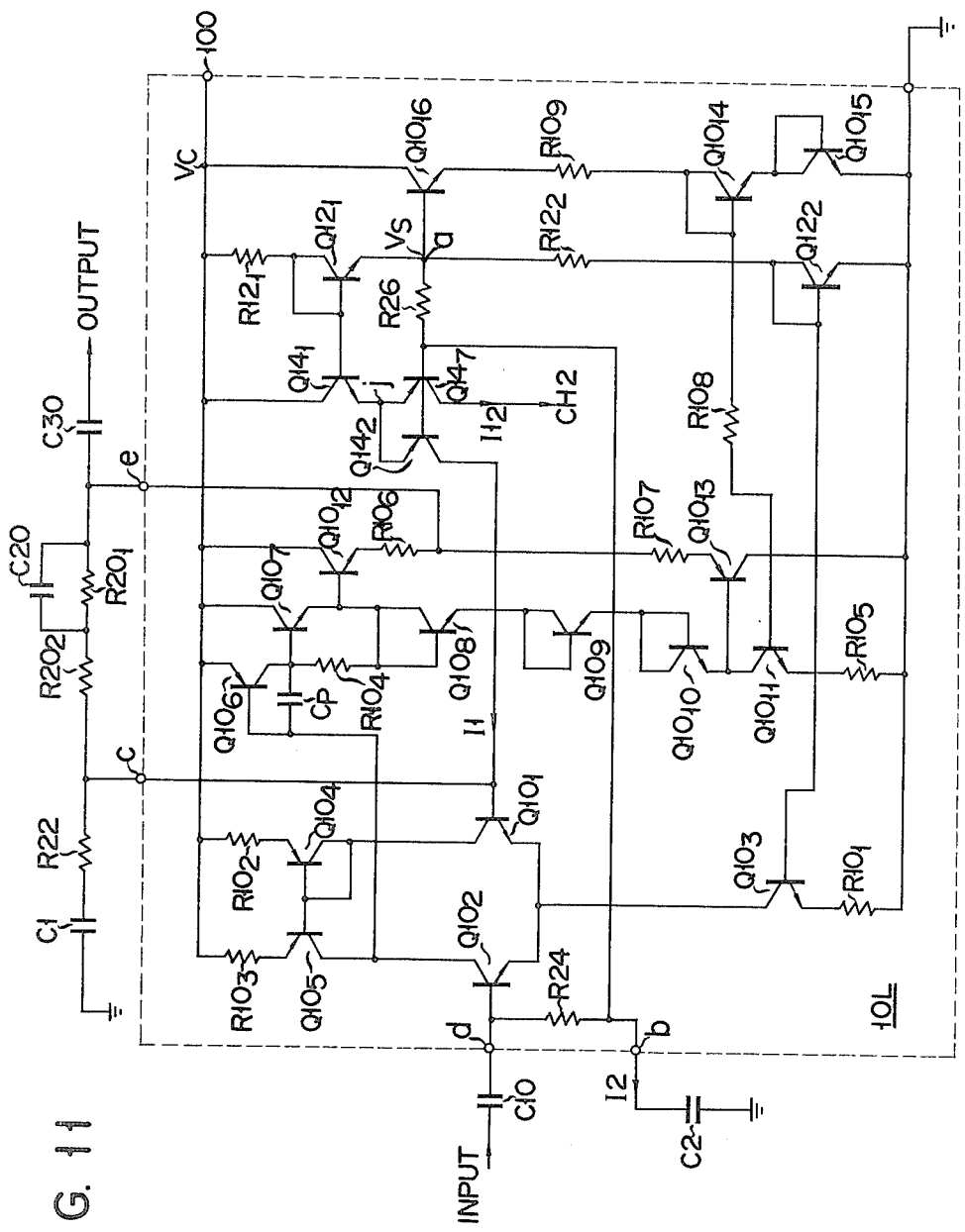
Figure 12:
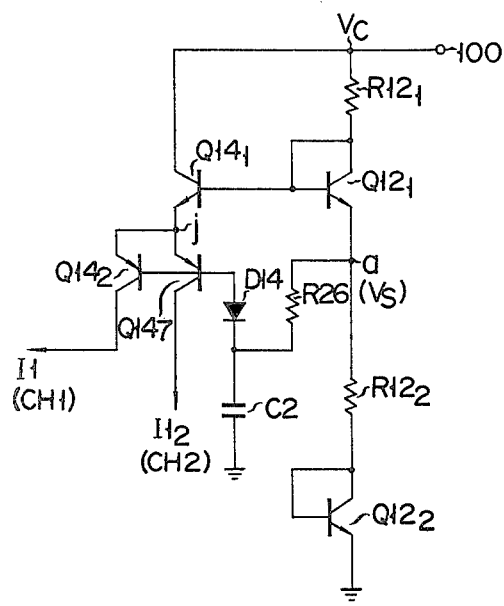
Figure 13:
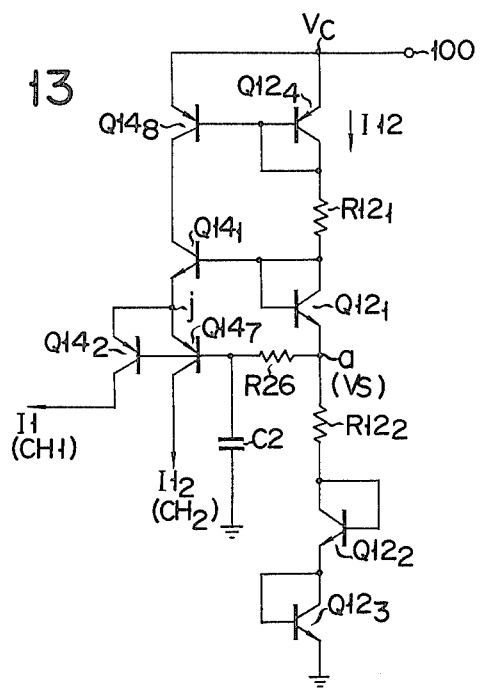

FIG. 4 graphically illustrates potentials variations at points a to e in the circuit in FIG. 3 after the time of power supply initiation;

FIG. 5 shows a circuit diagram of a modification of the circuit shown in FIG. 3;

FIG. 6 shows a circuit diagram of another modification of the circuit shown in FIG. 3 or FIG. 5;

FIG. 7 shows a circuit diagram of a modification of the circuit shown in FIG. 3, 5 or 6;

FIG. 8 shows a circuit diagram of a modification shown in FIG. 7;

FIG. 9 shows a circuit diagram of a modification shown in FIG. 8;

FIG. 10 shows a circuit diagram of a modification of the circuit shown in FIG. 5;

FIG. 11 shows a circuit diagram of a modification of the circuit shown in FIG. 10;

FIG. 12 shows a circuit diagram of a bias means and a precharge means of the circuit shown in FIG. 11; and FIG. 13 shows a circuit diagram of a modification of the circuit shown in FIG. 11 or FIG. 12.

Throughout the drawings, like reference symbols are used to designate like portions or equivalent portions, for simplicity of description.

Referring now to FIG. 1, there is shown a basic circuit construction of a bias circuit according to the invention. The output terminal e of an amplifier 10 is connected through a resistor R20 to the inverted input terminal c of the amplifier 10. The inverted input terminal c of the amplifier 10 is grounded through a resistor R22 and a first capacitor C1. The non-inverted input terminal d of the amplifier 10 to which an input signal is applied is connected to a bias means 12, through resistors R24 and R26. The connection point between the resistors R24 and R26 is grounded through a second capacitor C2. The bias means 12 provides a given bias potential Vs to the amplifier 10. The given bias potential Vs may clip a sine wave output signal of the amplifier 10 symmetrically with respect to zero level. When the amplifier 10 is an operational amplifier with an output stage of a general complementary push-pull type, the bias potential Vs is ½ of the power source potential Vc. When the output stage of the amplifier 10 is of a resistor load single construction, the relation Vs≃½Vc does not hold. When the output stage of the resistor load single construction is used, the relation between Vs and Vc changes on the basis of a load condition. How to set the relation between those voltages Vs and Vc is well known to those skilled persons in the art. Accordingly, it is just mentioned here that, in the case of the circuit construction as shown in FIG. 2, the potential Vs satisfying the following equation satisfies the condition permitting the symmetrical clipping operation.

$$Rc/R_L + 2 = Vc/Vs \qquad \ldots (1)$$

In the equation (1), it is assumed that a saturation voltage $V_{CE(SAT)}$ between the collector and emitter of an NPN transistor Q1 shown in FIG. 2 and the impedance of the output capacitor Co are zero. In the equation (1), when $R_C << R_L$, that is to say, the load impedance is as large as negligible, the relation Vs≃½Vc holds.

The bias means 12 provides Vs simultaneous with turning on of a power source (not shown). Immediately after the power source is turned on, the capacitor is not yet charged. For this, the potentials at the non-inverted input terminal d and the output terminal e are zero. The time constant of the circuit for charging the capacitor C2 is selected to be small. Therefore, after the power source is turned on, the potential at the non-inverted input terminal d of the amplifier 10 repidly increases up to the potential Vs. At this time, the capacitor C1 is in an uncharge condition, so that the potential at the inverted input terminal c of the amplifier 10 is much smaller than the potential Vs. Therefore, at this time, the output potential of the amplifier 10 rises to approach to the potential Vc. This is a major cause of the pop noise.

Note here that, until the potential at the non-inverted input terminal d of the amplifier 10 approaches to the potential Vs, charge current I2 continuously flows through the capacitor C2. Let us consider a case where the capacitor C1 is precharged by current I1 at a charging rate approximately equal to or more than the charging rate of the capacitor C2, corresponding to a change of the charging current I2. In this case, so long as the potential at the non-inverted input terminal d is less than the potential at the inverted input terminal c, the potential at the output terminal e of the amplifier 10 is almost zero. Assuming that, when the charging current I2 little flows, that is to say, the potential at the non-inverted input terminal d approaches to the potential Vs, the precharging to the capacitor C1 is ceased. In this case, the potentials at the non-inverted input terminal d and the inverted input terminal c substantially concurrently reach near the potential Vs. At this time, the potential at the output terminal e of the amplifier 10 rapidly rises toward the potential Vs and unlimitedly approaches to the potential Vs.

The precharge into the capacitor C1, which corresponds to the charging operation into the capacitor C2 as mentioned above, is performed by a precharge means 14. Through this precharge, the charging into the capacitor C1 is smoothly performed and the timing of the precharge is determined in accordance with the charging operation into the capacitor C2. This implies that the power source response as well as the pop noise is improved.

For a better understanding of the operation shown in FIG. 1, reference is made to FIG. 3 illustrating the detailed circuit construction of the FIG. 1 circuit. The amplifier 10 is supplied with power from a power supply circuit 100 at a potential Vc. The output terminal e of the amplifier 10 is connected through resistors $R20_1$ and $R20_2$ to the inverted input terminal c. The resistor $R20_1$ is coupled in parallel with a capacitor C20. The inverted input terminal c is grounded through a resistor R22 and a capacitor C1. The non-inverted input terminal d of the amplifier 10 is grounded through a resistor R24 and a capacitor C2. The node b between the resistor R24 and the capacitor C2 is coupled with the power supply circuit 100, through a resistor R26 and another resistor $R12_1$. The node a between the resistors $R12_1$ and R26 is grounded through the cathodanode path of a Zener diode ZD12. The non-inverted input terminal d of the amplifier 10 is coupled with an input signal source (not shown), through a coupling capacitor C10. The input signal source may be a playback head of a tape recorder, for example. With respect to DC or extremely low frequency AC, the terminal d is assumed to be grounded through the capacitor C10.

The connection point a between the Zener diode ZD12 is connected to the emitter of a transistor Q14 of PNP type. The base of the transistor Q14 is connected to the connection point b between the capacitor C2 and the resistor R26. The transistor Q14 is connected at the collector to the inverted input terminal c of the amplifier 10. In this circuit, the combination of the transistor Q14 and the resistor R14 corresponds to the precharge means 14 shown in FIG. 1. The bias means 12 shown in FIG. 1 corresponds to a voltage regulated circuit having the resistor R12, and the Zener diode ZD12. The Zener diode ZD12 may be replaced by a plurality of diodes connected in series and forwardly biased or a mere resistor.

Let us consider a case where the circuit shown in FIG. 3 is applied to a playback equalizer stage of a cassette tape recorder. It is assumed that the gain of the equalizer circuit at 1 KHz is 40 dB and the playback equalizer characteristic is 120 μs in high frequencies and 1.6 ms in low frequencies. If the amplifier 10 is an operational amplifier with a high input impedance and a high gain, the circuit components of the NFB circuit have the following values: $R20_1 = 160$ kΩ, $R20_2 = 12$ KΩ, $R22 = 200$ Ω and $C20 = 0.01$ μF. Here, if a low cut-off frequency (−3 dB point) in the equalizer circuit is selected to be 40 Hz, the capacitance of the capacitor C1 is 20 μF. Therefore, the time constant when the capacitor C1 is charged by the output signal from the amplified 10, is given by about 3.4 sec (=C1 ($R20_1+R20_2+R22$)). Under a condition that the interior resistance of the Zener diode ZD12 is zero, $R26 = 5.6$ KΩ and $C2 = 20$ μF, if the current amplification factor $h_{FE}$ of the transistor Q14 is sufficiently large, the time constant when the capacitor C2 is charged is about 0.11 sec (=C2R26). Further, when R24 = 47 KΩ and C10 = 0.33 μF, the charging time constant for the capacitor C10 is about 0.16 sec (=C10R24). Thus, the time constant taken from the instant when the power source switch is turned on till the potential at the non-inverted input terminal d is biased at a given potential Vs (corresponding to the Zener voltage of the diode ZD12), is approximately given by $\sqrt{0.11^2+0.16^2}(\simeq 0.2$ sec).

The charging time constants at the non-inverted input terminal d and the inverted input terminal c of the amplifier 10 are approximately 0.2 sec and 3.4 sec, respectively. Therefore, if the precharge current I1, which is at least 16 times as large as the charging current flowing into the capacitor C1 through the resistors R20$_1$ and R20$_2$, is fed into the capacitor C1, the power source response is greatly improved. Specifically, even though the charging time constant for the capacitor C1 with the resistors R20$_1$ and R20$_2$ is 3.4 sec, the time constant until the DC potential at the output terminal e of the amplifier 10 reaches the given potential Vs is approximately 0.2 sec, that is to say, it is very short.

The precharge current I1 is applied as a collector current of the transistor Q14. The magnitude of the current I1 corresponds to $h_{FE}$ times the base current flowing through the emitter-base circuit of the transistor Q14 when the capacitor C2 is charged. In this case, the $h_{FE}$ of the transistor Q14 must be at least 16 or more. When the current amplification factor $h_{FE}$ is set up at a given value, the adjustment of the charging time constant of the capacitor C1 so as to adapt it for the charging time constant of the capacitor C2 may be made by changing the value of the resistor R14. But this adjustment is not critical. Ordinarily, R14 =0. It is necessary to previously set those capacitors C1 and C2 so that the capacitor C1 is charged at slightly faster rate than the capacitor C2. The reason is that the transistor Q14 is cut off just before the capacitor C2 is charged up to the potential Vs and at this time the precharge current I1 becomes zero. When the current amplification factor $h_{FE}$ of the transistor Q14 or the charging current I2 is small, the resistor R26 may be omitted, that is to say, the resistance of the resistor R26 is set to be infinite, R26=∞.

FIG. 4 shows potential variation at the respective points a to e in the FIG. 3 circuit. For easy of understanding, the respective potential variations of FIG. 4 are exaggerated in illustration. As seen from the graph, when the power source switch is turned on at time $t_o$, the potential at the point a instantaneously reaches the potential Vs. From time $t_o$, the charging current I2 starts to flow into the capacitor C2. The magnitude of the current I2 decreases exponentially. Assume now that the threshold voltage $V_{BE}$ between the base and the emitter of the transistor Q14 is 0.56 V and the resistance of the resistor R26 is 5.6 kΩ. On this assumption, so long as I2≦100 μA, the transistor Q14 is turned on. In this case, the collector current of the transistor Q14, i.e. the precharge current I1 is substantially proportional to the precharge current I2.

After time $t_o$, the capacitor C1 is rapidly charged by the current I1 so that the potential at the point c instantaneously approaches to the potential Vs. As the charging into the capacitor C2 progresses, I2<100 μA at time t$_2$ and in turn the transistor Q14 is cut off. At this time, when the potential at point c is higher than that at potential d, the e point potential remains zero. Accordingly, after the transistor Q14 is cut off, the charge stored in the capacitor C1 is discharged. However, the charging into the capacitor C2 is continued even after time t$_2$. At time t$_4$, when the point d potential exceeds the point c potential, the point e potential increases toward the power source potential Vc. When the point e potential exceeds the point c potential, the capacitor C1 is recharged through the path of the resistors R20$_1$ and R20$_2$. After time t$_4$, the potentials at points c and d asymptotically approaches to the potential Vs. Then, the potential e also approaches to the potential Vs. At time t$_6$ that the potentials at the points c, d and e substantially reache the potential Vs, the amplifier 10 becomes in the stationary state. A potential change at the point e during the time period from t$_4$ to t$_6$ appears as the pop noise but the magnitude of it may be restricted to be small.

In FIG. 4, a curve CI indicates a variation of the potential at the point c when the charge current I1 is insufficient in its amplitude and the point d potential always exceeds the point c potential. As shown by the curve eI, the point e potential in this case rapidly rises near the power source potential Vc after time $t_o$. As the point c potential approaches to the potential Vs, the point e potential asymptotically approaches to the potential Vs. If the precharge current I1 is insufficient, the amplifier 10 becomes in the stationary state at time t8. As seen from the graph, in this case, the pop noise is apt to take place and the power source response is poor. Even in such a case where the current I1 is insufficient in amplitude, less pop noise is produced with better power source response, compared with a case where no current I1 is supplied.

A curve CII corresponds to a case where the supply of the current I1 is excessive. In this case, before time t$_{10}$, the point c potential is higher than the point d potential and the point e potential reamins zero. At time t$_{10}$, the point c potential asymptotically approaches to the point d potential (=Vs) and then the point e potential rises toward the potential Vs and the amplifier becomes in the stationary state. In this case, the pop noise is small but the time taken until it reaches the stationary state is long and therefore the power source response is poor. In the circuit construction shown in FIG. 3, however, the supply of the current I1 is ceased just before the point c potential reaches the potential Vs, with the result that curves as indicated by CII and eII are not plotted. If the circuit construction shown in FIG. 3 is used, an equalizer circuit with good power source response and small pop noise can be realized by properly selecting the magnitude of the precharge current I1 fed from the transistor Q14. When the time constant C10×R24 is much smaller than the time constant C2×R26, a degree of change of the point d potential is almost equal to that of the point b potential. In this case, the power source response is further improved.

FIG. 5 shows a modification of the circuit shown in FIG. 3. A major difference of the circuit of FIG. 5 from that of FIG. 3 resides in the constructions of the bias means 12 and the precharge means 14. in the FIG. 3 circuit, the given bias potential Vs is formed by the Zener diode ZD 12, that is to say, the Zener voltage is used as the given bias potential Vs. In the FIG. 5 circuit, the potential Vs is formed by using a voltage divider including a series circuit having resistors R12$_1$ and R12$_2$. In the case of the FIG. 5, the charging time constant for the capacitor C2 is approximately C2(R26+R12$_1$//R12$_2$). The precharge means 14 is comprised of a couple of complementary transistors. The collector of the NPN transistor Q14$_1$ is connected to the power supply circuit 100 of the potential Vc. The base of the transistor $Q14_1$ is supplied with the potential Vs from the connection point between the resistors $R12_1$ and $R12_2$. The emitter of the transistor $Q14_1$ is connected to the emitter of the PNP transistor $Q14_2$, through the anode-cathod path of a level shift diode D14. The diode D14 may be replace by a proper Zener diode. The base b of the transistor $Q14_2$ is connected through a resistor R26 to the base of the transistor $Q14_1$. The base b of the transistor $Q14_2$ is grounded through the capacitor C2, with the collector connecting to the inverted input terminal c of the amplifier 10. The non-inverted input terminal d of the amplifier 10 is connected to the base b of the transistor $Q14_2$, via a resistor R24.

The precharge current I1 is fed only when the transistors $Q14_1$ and $Q14_2$ are turned on. Those transistors $Q14_1$ and $Q14_2$ are turned on only when the potential between the bases of those transistors, i.e. a voltage drop across the resistor R26 exceeds a given threshold voltage between those bases. In this example shown in FIG. 5, if the threshold voltage of each PN junction is 0.6 V, the given threshold voltage is 2.4 V. If the resistor R26 is 24 KΩ, when the charging current I2 into the capacitor C2 is above 100 μA, transistors Q14, and $Q14_2$ are turned on. A part of the current I2 flowing through the resistor R26 is multiplied by $h_{FE}$ and becomes the precharge current I1.

The construction shown in FIG. 5 has two notable points. First is that the precharge current I1 is directly fed from the power supply circuit 100, through the collector and the collector circuit of the transistors $Q14_1$ and $Q14_2$. With this connection, when those transistors $Q14_1$ and $Q14_2$ are turned on, so long as a potential difference 2 $V_{CE(SAT)} + V_F$ is produced between the collectors of those transistors, the magnitude of the current I1 can be selected freely. Here, 2 $V_{CE(SAT)}$ indicates the sum of the collector-emitter saturation voltages of the transistors $Q14_1$ and $Q14_2$, and $V_F$ shows a forward voltage drop across the diode D14. When the transistors $Q14_1$ and $Q14_2$, and the diode D14 are made of silicon semiconductor, the 2 $V_{CE(SAT)} + V_F$ is below 2 V.

The second notable point is that, in the example of FIG. 5, the given threshold voltage can be freely changed and set to have a large value. In the FIG. 5 example, the given threshold voltage may be set stepwisely every 0.6 V in the voltage range above approximately 1.2 V. When the diode D14 is replaced by a Zener diode, the voltage range of the given threshold voltage may be further freely set. When it is desired to further broadly set the rise characteristic of each transistor $Q14_1$ and $Q14_2$ in the vicinity of the given threshold voltage, the connection of a resistor with a proper value between the emitters of the transistors $Q14_1$ and $Q14_2$ suffices. When the given threshold voltage is set large, the following merits are obtained. After the power source is turned on, when the precharge for the capacitor C1 is completed, the transistors $Q14_1$ and $Q14_2$ then must be in cut-off state. The reason for this is as follows. When the amplifier 10 is operating in a stationary state, if the precharge current I1 flows, the potential at the inverted input terminal c of the amplifier 10 increases, with the result that the operating point of the amplifier 10 may be off the point set by the potential Vs to distort the output signal from the amplifier 10. Such a distortion is apt to take place when the power source regulation is poor, that is to say, the potential Vc changes with the load variation.

Let us consider a case where, in a battery-dirve tape recorder with an output stage of B class operation, a large sound is suddenly produced and then it returns to a small sound. In this case, the potential Vc once drops and then the potential Vc rises. Such a voltage variation of the potential Vc causes the current I2 to temporarily flow. When the temporary current I2 causes a voltage drop of the given threshold voltage or more to be produced across the resistor R26, the transistors $Q14_1$ and $Q14_2$ are turned on. As a result, the precharge current I1 starts to flow and the distortion in the amplifier 10 is apt to occur. The turning-on of the transistors $Q14_1$ and $Q14_2$ due to the variation of the potential Vc may be avoided by setting the threshold voltage large. In order to the given threshold voltage may be made large by increasing the number of the PN junction of the diode D14 as required. If the diode D14 is not used, since the base-emitter circuits of the transistors $Q14_1$ and $Q14_2$ are connected in series, the given threshold voltage is larger than that of the FIG. 3 case.

In the case of FIG. 3, the given threshold voltage is only the threshold voltage (in the case of the silicon transistor, about 0.6 V) between the emitter and the base of the transistor Q14. Accordingly, if the current I2 varies, the distortion mentioned above easily takes place. In the construction of FIG. 3, however, the point a voltage Vs is fixed by the Zener diode ZD 12. For this, the current I2 is free from a variation of the power source potential Vc.

Turning now to FIG. 6, there is shown a modification of the circuit shown in FIG. 3 or 5. In the figure, the power supply circuit 100 of the potential Vc is connected to the capacitor C1, through a series circuit having a Zener diode ZD 14 and a resistor $R14_1$. The connection point a between resistors $R12_1$ and $R12_2$ providing the given bias potential Vs is grounded through the capacitor C2. In this case, the charging time constant for the capacitor C2 is given by $C2(R12_1//R12_2)$. In the circuit construction shown in FIG. 6, the resistor R26 which was used in the FIG. 3 or 5 circuit is omissible. Assume now that the power supply potential Vc=12 V, the bias potential Vs=6 V, and the Zener voltage of the Zener diode ZD14 is 7 V. In this case, when a power switch (not shown) is turned on, the potential Vc rises from 0 V to 12 V. At this point, the capacitor C1 is not yet charged so that the Zener diode ZD14 is broken down. If the interior resistance of the Zener diode ZD14 is negligible, the capacitor C1 is charged at the time constant $C1R14_1$. The time constant $C1R14_1$ is selected to be smaller than the time constant $C2(R12_1//R12_2)$. In other words, the potential at the inverted input terminal c of the amplifier 10 faster rises toward the potential Vs than the potential at the non-inverted input terminal d.

When the charging potential for the capacitor C1 reaches 5 V, the Zener diode ZD14 is cut off and the supply of the current I1 is ceased. Accordingly, the charging into the capacitor C2 progresses so that the point d potential catches up to the point e potential. At this time, the potential at the output terminal e of the amplifier 10 goes toward the potential Vs. Thus, also in the circuit construction shown in FIG. 6, the operations are attainable as indicated by the curves b to e in FIG. 4. In FIG. 6, the point a potential is not fixed by the Zener diode, for example. Therefore, the potential change at the point a or b correspond to the curve b shown in FIG. 4.

In the above example, when the potential Vc rises to be 13 V or more, the Zener diode ZD 14 with the Zener voltage 7 V is broken down so that the precharge current I1 starts to flow. However, this current may readily be prevented. Assume now that the potential Vc varies within a range $12 \pm 2$ V and Vs = 6 V. At this time, the selection of 8 to 9 V of Zener voltage for the Zener diode ZD14 suffices.

In the FIG. 3 or FIG. 5 circuit, the precharge current I1 was produced by current-amplifying a part of the charging current I2. On the other hand, in the FIG. 6 circuit, when the current I1 is made flow, the current I2 is directly not used. Also in the FIG. 6 circuit, however, until the charging potential for the capacitor C2, i.e. the point b potential, approaches to the given bias potential Vs, the supply of the precharge current I1 may be stopped. In other words, just before the capacitor C2 is charged up the capacitor C1 may be charged up to the potential approximate to that Vs by the Zener current I1 of the Zener diode ZD14.

Turning now to FIG. 7, there is shown a modification of the circuit FIG. 3, 5 or 6 circuit. In this example, the power supply circuit 100 of the potential Vc is grounded through a series circuit of resistors $R12_1$, $R12_3$ and $R12_4$. The connection point between the resistors $R12_1$ and $R12_3$ is coupled with the collector of an NPN transistor Q12. The base of the transistor Q12 is connected to the connection point between the resistors $R12_3$ and $R12_4$, with the emitter grounded. The resistors $R12_3$ and $R12_4$ and the transistor Q12 form a constant voltage or voltage regulated circuit which corresponds to the Zener diode ZD12 shown in FIG. 3.

The connection point between the resistors $R12_1$ and $R12_3$ is connected to the source and substrate of a P-channel enhancement mode FET $Q14_3$. The source of the FET $Q14_3$ is connected to the gate through the resistor R26. The gate of the FET $Q14_3$ is grounded through the capacitor C2 and is connected through the resistor R24 to the non-inverted input terminal d of the amplifier 10. The inverted input terminal c of the amplifier 10 is grounded through a resistor $R22_1$ and the capacitor C1. The connection point between the resistor $R22_1$ and the capacitor C1 is connected to the drain of the FET $Q14_3$ while at the same time to the output terminal e of the amplifier 10 through a resistor $R22_2$.

The operation of the FET $Q14_3$ is substantially the same as that described referring to the transistor Q14 in FIG. 3. As shown in FIG. 5, however, when the bias means 12 providing the potential Vs does not include a voltage regulator, the circuit construction shown in FIG. 7 is superior to that shown in FIG. 3. Generally, the threshold voltage between the gate and source of the enhancement MOS FET is in the order of several volt. Accordingly, after the operation point of the amplifier 10 reaches a stationary state, even if the charging current I2 flows into the capacitor C2 due to a variation of the potential Vc, so long as a voltage drop produced across the resistor R26 does not exceed the threshold voltage, the FET $Q14_3$ is not turned on by no means. That is to say, by using the FET $Q14_3$, an effect is attainable which is similar to that when the diode D14 is used in FIG. 5.

The provision of the resistor $R22_3$ may speed up the charging speed of the capacitor C1 by the output potential of the amplifier 10. The reason for this is that the resistance of the resistor $R22_3$ may be selected to be as small as one desires so far as the output capacity of the amplifier 10 permit. When the MOS FET is used in the precharge means 14, the magnitude of the precharge current I1 which may be provided is smaller than that when the bipolar transistor is used. However, co-operation with the resistor $R22_2$ can sufficiently speed up the charging speed into the capacitor C1 after the power source is turned on. Such a resistor $R22_2$ may be used in the circuit using a bipolar transistor Q14 or a Zener diode ZD14 as the precharge means 14, as in the case of the FIG. 3 or 6 circuit. The drain of the FET $Q14_3$ may be directly connected to the inverted input terminal c of the amplifier 10 and not directly to the capacitor C1.

FIG. 8 shows another modification of the circuit shown in FIG. 3 or FIGS. 5 to 7. The power supply circuit 100 of the potential Vc is grounded through a resistor $R12_1$ and a diode D12. The diode D12 is comprised of a diode block including a plurality of PN junctions. The diode D12 is forwardly biased to provide the bias potential Vs to the anode terminal. The anode of the diode D12 is connected to the base of an NPN transistor $Q14_4$ and is grounded through the resistor R26 and the capacitor C2. The connection point between the resistor R26 and the capacitor C2 is connected to the emitter of the transistor $Q14_4$ and to the non-inverted input terminal d of the amplifier 10 through the resistor R24. The collector of the transistor $Q14_4$ is connected to the base of a PNP transistor $Q14_5$. The emitter of the transistor $Q14_5$ is connected to the power supply circuit 100, through a Zener diode $ZD14_1$ for level shift. The collector of the transistor $Q14_5$ is connected to the inverted input terminal c of the amplifier 10.

The precharge means 14 shown in FIG. 8 is the combination of the precharge means in FIGS. 3 and 6. when the charging current I2 flows into the capacitor C2 after the power source (not shown) is turned on, the transistor $Q14_4$ is turned on. Following this, the transistor $Q14_5$ also is turned on so that the precharge current flows into the capacitor C1. When the Zener diode $ZD14_1$ is not provided, the turning-on of the transistor $Q14_5$ causes the potential at the inverted input terminal c of the amplifier 10 to once increase near the power supply potential Vc (cf. curve CII of FIG. 4). If the Zener voltage of the Zener diode $ZD14_1$ is properly selected, a characteristic as shown by the curve c in FIG. 4 may be obtained. The Zener voltage of the Zener diode $ZD14_1$ has a preferable value of approximately Vc − Vs.

FIG. 9 shows a modification of the FIG. 8 circuit. In the case of FIG. 8, the level shift Zener diode $ZD14_1$ is inserted in the emitter circuit of the transistor $Q14_5$. In FIG. 9, the Zener diode $ZD14_1$ is insertd in the collector circuit of the transistor $Q14_5$. In either of those circuits in FIG. 8 or 9, the Zener diode $ZD14_1$ is used to limit an excessive rise of the point c potential when the transistor $Q14_5$ is turned on. Thus, the Zener diode $ZD14_1$ may be inserted in the emitter or the collector side of the transistor $Q14_5$. If necessary, the level-shift Zener diode may be inserted in both sides of it. The Zener diode $ZD14_1$ may be replaced by a diode block having a plurality of PN junctions which is capable of providing a forward voltage drop corresponding to the Zener voltage or a resistor having such the resistance as to provide said forward voltage drop.

Also in the FIG. 9 circuit, a constant current source IS 12 is used for providing the bias voltage Vs. The constant current source may be formed by a known circuit construction. The potential Vs after the amplifier 10 becomes in a stationary state is determined by the product of the resistance of a resistor $R12_2$ and the constant current IS 12 and not by the power supply potential Vc. Accordingly, a variation of the potential Vc does not turn on the transistors $Q14_4$ and $Q14_5$.

FIG. 10 shows a modification of the circuit shown in FIG. 5. In FIG. 10, two amplifier circuits coupled in series are provided with the precharge means 14, respectively. An NPN transistor $Q14_1$ is connected at the collector to the power supply circuit 100 and at the base to the same through a resistor $R12_1$. The base a of the transistor $Q14_1$ is grounded through a resistor $R12_2$ and to the base b of a PNP transistor $Q14_2$ through the resistor R26. The base of the transistor $Q14_2$ is grounded through the capacitor C2 and its collector is connected to the inverted input terminal c of the amplifier 10. The emitter of the transistor $Q14_2$ is connected to the emitter of the transistor $Q14_1$. The inverted input terminal c is grounded through the resistor R22 and the capacitor C1 and is connected to the output terminal e of the amplifier 10 through an equalizer circuit having resistors $R20_1$ and $R20_2$ and the capacitor C20. The non-inverted input terminal d of the amplifier 10 is connected to the base b of the transistor $Q14_2$, through the resistor R24 and is connected to ground through a capacitor C10 and a playback head 110. As described above, the circuit construction associated with the amplifier 10 is substantially the same as that of the circuit in FIG. 5. The emitter and the base of the transistor $Q14_2$ are connected to the emitter and base of a PNP transistor $Q14_6$, respectively. The collector of the transistor $Q14_6$ is connected to the inverted input terminal of f of an amplifier $10_1$. The inverted input terminal f is connected to the output terminal h of the amplifier $10_1$, via a resistor $R20_3$, and is connected to ground through a resistor $R22_3$ and a capacitor $C1_1$. The non-inverted input terminal g of the amplifier $10_1$ is connected to the ouput terminal e of the amplifier 10, through a capacitor C30. The non-inverted input terminal g is connected to the base of the transistor $Q14_2$ via the resistor $R24_1$. When the input circuit of the amplifiers 10 and $10_1$ is comprised of a differential amplifier, the potentials at the output terminals e and the non-inverted input terminal g are substantially equal to each other. Accordingly, the non-inverted input terminal g may be directly coupled with the output terminal e of the amplifier 10. The output signal from the amplifier $10_1$ is taken out through a capacitor $C30_1$.

The precharge operation for the amplifier 10 has been stated referring to FIG. 5. Note here that a single precharge means (Q14, $Q14_2$ and $Q14_6$) enables an precharge operation, i.e. feeding of charge currents I1 and $I1_1$, to be simulataneously made to different amplifiers. If, in this way, the charge current (I1, $I1_1$) feedings into the first capacitors (C1, C2) in NF loops are carried out in a plurality of amplifier stages (10, $10_1$), the power source response at the final output terminal h when the power source is turned is further improved.

FIG. 11 shows a modification of the FIG. 10 circuit. In the FIG. 11 circuit, there is illustrated a detailed circuit construction of the amplifier 10. The power supply circuit 100 is connected to the collector and the base of a PNP transistor $Q12_1$, through a resistor $R12_1$. The emitter a of the transistor $Q12_1$ is connected to the base and collector of an NPN transistor $Q12_2$, by way of a resistor $R12_2$. The emitter of the transistor $Q12_2$ is connected to ground. The base of the transistor $Q12_1$ is connected to the base of an NPN transistor $Q14_1$. The transistor $Q14_1$ is connected at the collector to the power supply circuit 100 and at the emitter j to the emitters of PNP transistors $Q14_2$ and $Q14_7$. The bases of the transistors $Q14_2$ and $Q14_7$ are connected to the emitter a of the transistor $Q12_1$, by way of a resistor R26.

The collector of the transistor $Q14_2$ is connected to the base of an NPN transistor $Q10_1$. The base or point b of the transistor $Q14_2$ is connected to the base of an NPN transistor $Q10_2$, through a resistor R24. The emitters of the transistors $Q10_1$ and $Q10_2$ are connected to the collector of an NPN transistor $Q10_3$. The emitter of the transistor $Q10_3$ is connected to ground through a resistor $R10_1$, with the base connecting to the base of the transistor $Q12_2$. The transistors $Q10_1$ and $Q10_2$ cooperate to form a differential input circuit and the transistor $Q10_3$ forms a constant current circuit for setting the common mode rejection ratio (CMRR) of the differential transistors $Q10_1$ and $Q10_2$ to be large. The collectors of the PNP transistors $Q10_1$ and $Q10_2$ are coupled with the collectors of PNP transistors $Q10_4$ and $Q10_5$, respectively. The bases of the transistors $Q10_4$ and $Q10_5$ are connected to the collector of the transistor $Q10_4$. The emitters of the transistors $Q10_4$ and $Q10_5$ are connected to the power supply circuit 100, via resistors $R10_2$ and $R10_3$. The transistors $Q10_4$ and $Q10_5$ cooperate to form a current mirror circuit.

The collector of the transistor $Q10_5$ is connected to the base of a PNP transistor $Q10_6$. The collector of the transistor $Q10_6$ is connected to the base of an NPN transistor $Q10_7$. The emitter of the transistor $Q10_6$ and the collector of the transistor $Q10_7$ are connected to the power supply circuit 100. The collector of the transistor $Q10_6$ is connected through a phase compensating capacitor $C_P$ to the base of the transistor per se and is connected to the emitter of the transistor $Q10_7$, through a resistor $R10_4$. The transistors $Q10_6$ and $Q10_7$ form an inverted Darlington circuit. The emitter of the transistor $Q10_7$ is connected to the collector of a transistor $Q10_{11}$ of NPN type, through NPN transistors $Q10_8$ and $Q10_{10}$. The emitter of the transistor $Q10_{11}$ is connected to ground via a resistor $R10_5$. The transistor $Q10_{11}$ is used as a constant current load for the inverted Darlington transistors $Q10_6$ and $Q10_7$.

The emitter of the transistor $Q10_7$ is connected to the base of an NPN transistor $Q10_{12}$. The transistor $Q10_{12}$ is connected at the collector to the power supply circuit 100 and at the emitter to the emitter of a PNP transistor $Q10_{13}$, through resistors $R10_6$ and $R10_7$. The transistor $Q10_{13}$ is connected at the base to the collector of the transistor $Q10_{11}$ and at the collector to ground. The base of the transistor $Q10_{11}$ is connected through the resistor $R10_8$ to the base and the collector of an NPN transistor $Q10_{14}$. The transistor $Q10_{14}$ is grounded through an NPN transistor $Q10_{15}$ connected in diode fashion. The collector of the transistor $Q10_{14}$ is connected through a resistor $R10_9$ to the emitter of an NPN transistor $Q10_{16}$. The base of the transistor $Q10_{16}$ is connected to the emitter a of the transistor $Q12_1$, with the collector connecting to the power feeding circuit 100.

The connection point between the resistors $R10_6$ and $Q10_7$ is connected to the output terminal e of the amplifier 10. The base of the transistor $Q10_1$ is connected to the inverted input terminal c. The base of the transistor $Q10_2$ is connected to the non-inverted input terminal d. The transistor $Q14_7$ is used as a precharge means for second channel. An amplifier 10R is additionally provided which has a construction similar to that of an amplifier 10L having transistors $Q10_1$ to $Q10_{13}$, and the transistor Q14$_7$ feeds the precharge current I1$_2$ to the inverted input side of the amplifier 10R.

In the amplifier 10L with a construction shown in FIG. 11, the given bias potential Vs is selected to be ½ of the power supply potential Vc. If a portion enclosed by a broken line in the circuit construction shown in FIG. 11 is fabricated by the IC technology, the following merits are obtainable. The resistors in the IC circuit are formed by the diffusion. The diffusion resistors have generally varied resistance values usually with about 20% of variation. However, its relative variation within the same chip is extremely small (usually a few %). Therefore, if R12$_1$=R12$_2$, for example, the resistance ratio R12$_1$/R12$_2$ is approximately 1. In the same chip, a variation of transistors of the same conductivity type is also small. Therefore, the relation Vs=½ Vc may be kept almost invariable among a number of IC chips mass-produced.

The base potentials of the transistors Q14$_1$ and Q12$_1$ are equal to each other. Note here that, when those transistors are turned on, the potentials at the point j potential and the point a potential are equal. When, with precharging into the first capacitor C1 connected to the inverted input terminal c, the potential at the inverted input terminal c approaches to the potential Vs, the collector current of the transistor Q14$_2$ or the precharge current I1 is extremely small. As a result, the saturation voltage V$_{CE(SAT)}$ between the collector and emitter of the transistor Q14$_2$ also becomes almost zero. The pregression of the precharging causes the potential at the inverted input terminal c point to approach to the potential at the emitter j of the transistor Q14$_1$ or the given bias potential Vs. The potential variation at the inverted input terminal c at this time exhibits a smooth exponential variation as indicated by the curve b, rather than the curve c shown in FIG. 4. Thus, a power source response wave form at the output terminal e is not the wave form as indicated by the curve e but the wave form as indicated by the curve eII. However, the time that the amplifier 10L becomes in a stationary state, i.e. the time that the curve e asymptotically approaches to the potential Vs, is far before time t$_{10}$ in FIG. 4 around time t$_6$.

FIG. 12 shows a modification of a part of the circuit shown in FIG. 11 which corresponds to the bias means 12 and the precharge means 14. The bases of the PNP transistors Q14$_2$ and Q14$_7$ are connected through the anode-cathod path of the DC level shift diode D14 to the connection point between the second capacitor C2 and the resistor R26. The reason why the diode D14 is used is the same as that of the provision of the diode D14 in FIG. 5. After the amplifier 10 becomes in a stationary state, when a variation of the power supply potential Vc causes the charging current to flow into the second capacitor C2, the diode D14 is provided to prevent the precharge current I1 from flowing.

FIG. 13 shows a modification of the circuit shown in FIG. 11 or 12. A major feature of the circuit resides in the provision of a current mirror circuit between the power supply circuit 100 and the bias means 12 with the precharge means 14. Specifically, the power supply circuit 100 is connected to PNP transistors Q12$_4$ and Q14$_8$, those forming a current mirror circuit. The base and the collector of the transistor Q12$_4$ are connected through the resistor R12$_1$ to the base and the collector of the transistor Q12$_1$ of NPN type. The emitter of the transistor Q12$_1$ is connected through the resistor R12$_2$ to the base and collector of the NPN transistor Q12$_2$. The emitter of the transistor Q12$_2$ is connected to the base and the collector of an NPN transistor Q12$_3$, and the emitter of the transistor Q12$_3$ is grounded.

The base of the transistor Q14$_8$ is connected to the base of the transistor Q12$_4$. The collector of the transistor Q14$_8$ is connected to the collector of the NPN transistor Q14$_1$. The base of the transistor Q14$_1$ is connected to the base of the transistor Q12$_1$ and the emitter j of the transistor Q14$_1$ is connected to the emitters of the PNP transistors Q14$_2$ and Q14$_7$, respectively. The bases of the transistors Q14$_2$ and Q14$_7$ are grounded via the second capacitor C2 and to the emitter a of the transistor Q12$_1$ through the resistor R26. The precharge currents I1 and I1$_2$ are taken out from the collectors of the transistors Q14$_2$ and Q14$_7$, respectively.

When the emitter point a potential of the transistor Q12$_1$, i.e. the given bias potential Vs, is selected to be ½ Vc, R12$_1$ must be selected to be equal to R12$_2$. The sum 2V$_{BE}$ of the base-emitter voltages of the transistors Q12$_1$ and Q12$_4$ is compensated by the sum 2V$_{BE}$ of the base-emitter voltage of the transistors Q12$_2$ and Q12$_3$. The collector current I12 of the transistor Q12$_4$ is given by $$(Vc-4V_{BE})/(R12_1+R12_2) \quad (2)$$

At this time, because of the nature of the current mirror circuit, the magnitude of the precharge current I1+I1$_2$ or the collector current of the transistor Q14$_8$ is given by kI12. Here, k is a constant determined by a ratio (S14/S12) of the emitter area (S14) of the transistor Q14$_8$ to the emitter area (S12) of the transistor Q12$_4$. When the current I12 is calculated in accordance with the equation (2), the maximum magnitude of the precharge current I1+I1$_2$ is automatically determined.

In both cases of FIGS. 12 and 13, the point a potential and the point j potential are equal so long as the precharge current is fed. Therefore, the merits attained by the FIG. 11 circuit may be attained similarly, also in the FIGS. 12 and 13 circuits.

Although a specific circuit has been illustrated and described herein, it is not intended that the invention be limited to the elements and the circuit arrangements disclosed. One skilled in the art will recognize the particular elements or sub-circuits may be used without departing from the scope and spirit of the invention.

What is claimed is:

1. A bias circuit for a linear amplifier comprising:
   (a) amplifier means with inverted and non-inverted input terminals;
   (b) negative feedback means inserted between the output terminal of the amplifier means and the inverted input terminal;
   (c) a first capacitor inserted between a feedback signal circuit of said negative feedback means and a circuit with zero AC potential, said first capacitor making a DC transfer function of said feedback means larger than an AC transfer function of it;
   (d) bias means for applying to said amplifier means such a given bias potential as to clip the AC output signal from said amplifier means symmetrically with respect to zero level;
   (e) a second capacitor connected between a circuit for providing the given bias potential and the circuit with zero AC potential in a place disposed between said bias means and the non-inverted input terminal of said amplifier means, said second capacitor being charged by said bias means from the instant when a power supply circuit starts to supply power to said amplifying means; and (f) precharge means for feeding precharge current to said first capacitor only for a period of time from the initiation of the power supply to said amplifier means until said amplifier means is biased by the given bias potential.

2. A bias circuit according to claim 1 wherein the magnitude of the precharge current is so selected that, during the time that said precharge means feeds the precharge current, a potential at the inverted input terminal of said amplifier means is faster approaching to the given bias potential than a potential at the non-inverted input terminal.

3. A bias circuit according to claim 1 or 2, wherein said feedback means comprises: a first impedance circuit connected between the output terminal and the inverted input terminal of said amplifier means; a second impedance circuit connected between the inverted input terminal of said amplifier means and said first capacitor; a charging resistor connected between the connection point between said second impedance circuit and said first capacitor, and the output terminal of said amplifier means, said charging resistor being used for making small a charge time constant of said first capacitor by the output terminal potential of said amplifyer means.

4. A bias circuit according to claim 1 or 2, wherein said bias means is provided with a potential divider circuit including a plurality of resistors connected in series, whereby said potential divider circuit divides the power supply potential for said amplifier means to provide the given bias potential.

5. A bias circuit according to claim 1 or 2, wherein said bias means includes first to third resistors connected in series, and a transistor which is connected at the collector to the connection point of the other end of the first resistor and one end of the second resistor, at the base to the connection point between the other end of the second resistor and one end of the third resistor and at the emitter to the other end of the third resistor, wherein the power supply potential for said amplifier means is applied to one end of the first resistor and the given bias potential is derived from the connection point between the first and second resistors.

6. A bias circuit according to claim 1 or 2, wherein said bias means includes a Zener diode of which the given Zener voltage determines the given bias voltage.

7. A bias circuit according to claim 1 or 2, wherein said bias means includes a diode block having a plurality of PN junctions of which the forward biased voltage drop determines the given bias potential.

8. A bias circuit according to claim 1 or 2, wherein said bias means includes a series circuit having a constant current source and a bias resistor, and the given bias potential is determined by a voltage drop produced across the bias resistor by the current supplied from the constant current source.

9. A bias circuit according to claim 1 or 2, wherein said precharge means comprises a precharge transistor which is supplied at the emitter with the given bias potential is coupled at the collector with the first capacitor, and of which the emitter to base circuit permits the flow of the base current corresponding to the charging current flowing into the second capacitor, whereby said precharge transistor feeds the precharge current into the first capacitor only when the base current flows.

10. A bias circuit according to claim 1 or 2, wherein said precharge means comprises a first precharge transistor of a first conductivity type which is supplied at the collector with the power supply potential for said amplifier means, and at the base with the given bias potential; and a second precharge transistor of a second conductivity type which is coupled at the emitter to the emitter of said first precharge transistor and at the collector to said first capacitor, and the base to emitter circuit of said first precharge transistor and the emitter to base circuit of said second precharge transistor permit the flow of a base current corresponding to the charging current to said second capacitor, whereby said first and second precharge transistors feed the precharge current to said first capacitor only when the base current flows.

11. A bias circuit according to claim 10, wherein said precharge means further comprises first DC level shift means inserted between the emitter of said first precharge transistor and the emitter of said second precharge transistor, and a shunt resistor connected between the bases of said first and second precharge transistors, permitting the charging current, whereby the magnitude of a given threshold voltage when said first and second precharge transistors are turned on by a voltage drop produced across said shunt resistor, is increased by an amount of the voltage shifted by said first DC level shift means.

12. A bias circuit according to claim 11, wherein said first DC level shift means is comprised of a forward biased diode having at least one PN junction.

13. A bias circuit according to claim 11, wherein said first DC level shift means is comprised of a Zener diode.

14. A bias circuit according to claim 1 or 2, wherein said precharge means comprises a precharge Zener diode inserted between said power supply circuit for said first amplifyer means and said first capacitor, and the Zener voltage of the precharge Zener diode is above a potential difference between the potential of said power supply circuit and the given bias potential but below a potential difference between the potential of said power supply circuit and the potential of the AC potential zero circuit.

15. A bias circuit according to claim 14, wherein said precharge means further includes an adjusting resistor connected in series with the precharge Zener diode in order to adjust the charging speed into said first capacitor.

16. A bias circuit according to claim 1 or 2, wherein said precharge means comprises a precharge enhancement mode FET which is coupled at the first terminal of source terminal with the bias potential, at the second terminal or drain terminal with said first capacitor and applied across the first terminal to gate terminal path with a gate voltage corresponding to the charging current to said second capacitor, whereby said FET feeds the precharge current to said precharge capacitor only when the gate voltage exceeds the threshold voltage of said FET.

17. A bias circuit according to claim 1 or 2, wherein said precharge means comprises a first precharge transistor of a first conductivity type which is coupled at the base with the given bias potential and of which the base to emitter circuit permits the flow of base current corresponding to the charge current to said second capacitor, a second precharge transistor of a second conductivity type which is coupled at the base with the collector of said first precharge transistor at the emitter with the power supply circuit, and at the collector with said second capacitor, and a second DC level shift means inserted in series in the emitter to collector circuit of said second precharge transistor between said first capacitor and said power supply circuit.

18. A bias circuit according to claim 17, wherein said second DC level shift means is comprised of a Zener diode.

19. A bias circuit according to claim 17, wherein said second DC level shift means is comprised of a diode having a plurality of PN junctions.

20. A bias circuit according to claim 17, wherein said second DC level shift means is comprised of a resistor.

21. A bias circuit according to claim 1 or 2, wherein said amplifier means includes a plurality of individual amplifiers, said feedback means is provided for each of said amplifiers, said first capacitor is provided for each feedback means, and said precharge means feeds precharge currents to said respective precharge means.

22. A bias circuit according to claim 1 or 2, wherein said bias means comprises a first resistor connected at one end to said power supply circuit, a first bias transistor of a first conductivity type which is connected at the base and collector to the other end of said first resistor, and a second resistor which is connected at one end to the emitter of said first bias transistor coupled with the given bias potential and at the other end to the AC potential zero circuit, and wherein said precharge means comprises a first precharge transistor of a first conductivity type which is connected at the collector to said power supply circuit, at the base to the base of said first bias transistor, and a second precharge transistor of a second conductivity type which is connected at the emitter to the emitter of said first precharge transistor, at the collector to said first capacitor, and the base to emitter circuit of said first precharge transistor and the emitter to base circuit of said second precharge transistor permit the flow of a base current corresponding to the charge current to said second capacitor, whereby said first and second transistors feed the first precharge current into said first capacitor only when the base current flows, and the potential at the emitter of said first precharge transistor when the first precharge current flow is substantially equal to the given bias potential.

23. A bias circuit according to claim 22, wherein said precharge means further comprises at least one third precharge transistor which is connected at the emitter and the base with the emitter and the base of said second precharge transistor, with the collector providing a second precharge current with a magnitude substantially the same as that of the first precharge current, and said second precharge current is fed to another first capacitor which is different from said capacitor supplied with the first precharge current.

24. A bias circuit according to claim 22, wherein said precharge means further comprises a first DC level shift means inserted between the base of said second precharge transistor and said second capacitor, and a shunt resistor which is connected to a connection point between said first DC level shift means and the second capacitor, and the emitter of said first bias transistor, whereby the magnitude of a given threshold voltage when said first and second precharge transistors are turned on by a voltage drop across said shunt resistor, is increased by an amount of voltage shifted by said first DC level shift means.

25. A bias circuit according to claim 24, wherein said first DC level shift means is comprised of a forward biased diode having at least one PN junction.

26. A bias circuit according to claim 24, wherein said first DC level shift means is comprised of a Zener diode.

27. A bias circuit according to claim 22, wherein said bias means further comprises a second bias transistor of a second conductivity type which is connected at the emitter to said power supply circuit, and at the base and collector to one end of said first resistor, and said precharge means further comprises a fourth precharge transistor of a second conductivity type which is connected at the emitter to said power supply circuit, at the base to the base of said second bias transistor, and at the collector to the collector of said precharge transistor, said fourth precharge transistor forming a current miller circuit together with said second bias transistor, whereby the magnitude of said first precharge current is determined by the collector current of said second bias transistor.

28. A bias circuit according to claim 25, wherein said second bias transistor and said fourth precharge transistor are formed on the same semiconductor substrate, and the magnitude ratio of the collector current of said second bias transistor to the first precharge current is determined by the ratio of the emitter area of said second bias transistor to the emitter area of said fourth precharge transistor.

* * * * *